US006980272B1

(12) United States Patent
Matthies

(10) Patent No.: US 6,980,272 B1
(45) Date of Patent: Dec. 27, 2005

(54) ELECTRODE STRUCTURE WHICH SUPPORTS SELF ALIGNMENT OF LIQUID DEPOSITION OF MATERIALS

(75) Inventor: Dennis Lee Matthies, Mercer, NJ (US)

(73) Assignee: Sarnoff Corporation, Princeton, NJ (US)

(*) Notice: Subject to any disclaimer, the term of this patent is extended or adjusted under 35 U.S.C. 154(b) by 762 days.

(21) Appl. No.: 09/718,225

(22) Filed: Nov. 21, 2000

(51) Int. Cl.[7] ............................................. G02F 1/1343
(52) U.S. Cl. ...................................... 349/139; 349/143
(58) Field of Search ................................ 349/155–156, 349/139, 142–143

(56) References Cited

U.S. PATENT DOCUMENTS

| | | | |
|---|---|---|---|
| 3,863,332 A | * | 2/1975 | Leupp et al. ................ 349/155 |
| 4,295,712 A | * | 10/1981 | Ishiwatari ................... 349/155 |
| 4,528,480 A | | 7/1985 | Unagami et al. ......... 315/169.1 |
| 4,792,500 A | | 12/1988 | Kojima ........................ 428/690 |
| 4,843,280 A | | 6/1989 | Lumbard et al. ........... 313/500 |
| 5,099,301 A | | 3/1992 | Kikinis ......................... 357/41 |
| 5,156,924 A | | 10/1992 | Taniguchi et al. .......... 428/690 |
| 5,281,805 A | | 1/1994 | Sauer ......................... 250/214 |
| 5,283,500 A | | 2/1994 | Kochanski ................... 315/58 |
| 5,317,236 A | | 5/1994 | Zavracky et al. ......... 315/169.3 |
| 5,378,963 A | | 1/1995 | Ikeda ........................... 313/895 |
| 5,661,531 A | | 8/1997 | Greene et al. ................ 349/73 |
| 5,739,545 A | | 4/1998 | Guha et al. ................... 257/40 |
| 5,838,414 A | * | 11/1998 | Lee .............................. 349/157 |
| 5,867,236 A | | 2/1999 | Babuka et al. ................ 349/73 |
| 5,956,224 A | * | 9/1999 | Jeon ............................. 361/303 |

* cited by examiner

*Primary Examiner*—Dung T. Nguyen
(74) *Attorney, Agent, or Firm*—William J. Burke

(57) ABSTRACT

An improved two layer electrode structure is fabricated on a surface. According to one aspect of the invention, the first layer of the electrode structure is designed to provide electrical contact to a fluid electronic material and the second layer of the electrode structure is formed so as to constrain the fluid electronic material in a precise pattern. Alternatively, the second layer of the two-layer electrode structure includes a low surface energy material to further assist in constraining the fluid electronic material to the desired pattern. In another alternative, the first layer of the electrode structure includes a transparent electrode material, that is coupled to an electro-optical device. The second layer of this electrode structure includes a high conductivity material that is coupled to the first layer of the electrode structure in an area not directly over the electro-optical device to improve the conductivity of the transparent electrode structure.

30 Claims, 10 Drawing Sheets

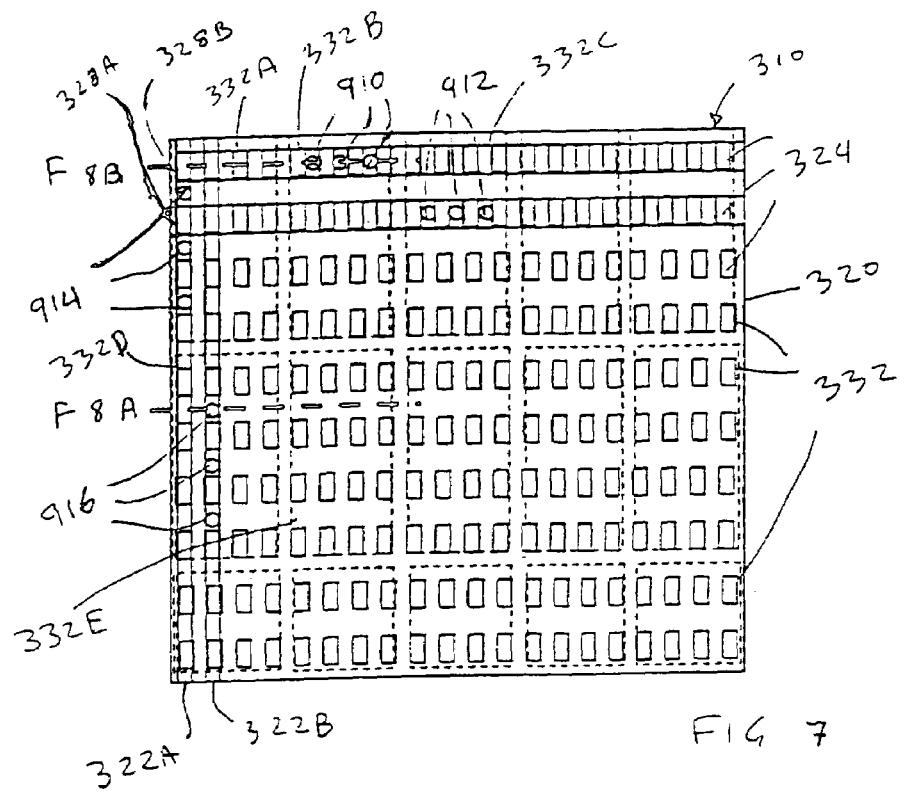
FIG 7
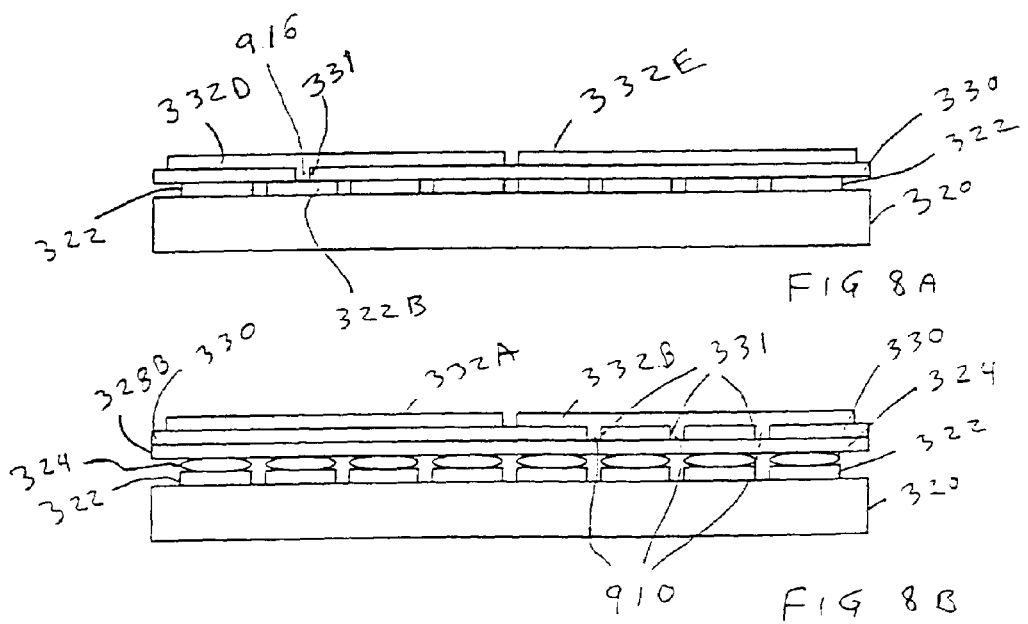
FIG 8A
FIG 8B

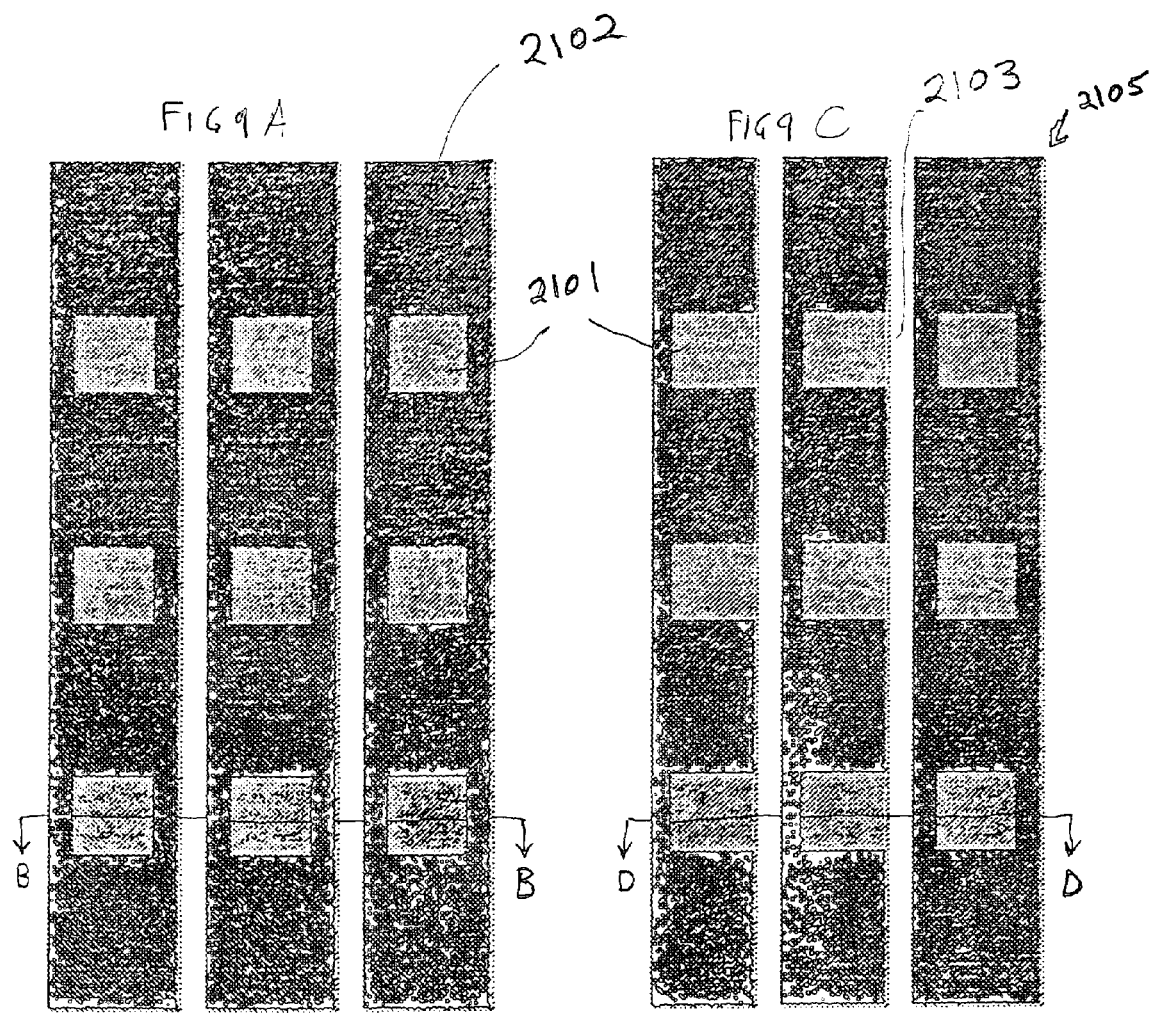
FIG 9A
FIG 9C
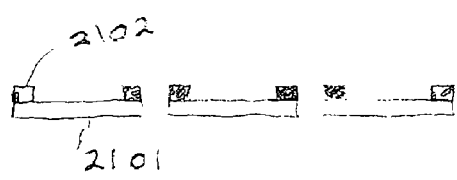
FIG 9B
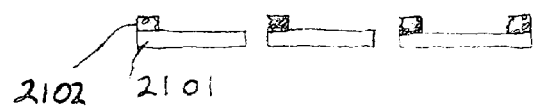
FIG 9D

ELECTRODE STRUCTURE WHICH SUPPORTS SELF ALIGNMENT OF LIQUID DEPOSITION OF MATERIALS

BACKGROUND OF THE INVENTION

The present invention concerns electro-optic devices, having particular advantages in large-area display devices which are formed as an array of tiled display devices.

There is an unmet need for large-area flat displays. No clear solution is apparent in the market place. This unmet need is becoming increasingly critical since the advancement of information results in increasing amounts of data to be displayed. A solution for large-area displays is needed to serve as the human interface for conveying information from sensors, computers, databases, cameras, etc. in this information dominated age. Many critical applications demand large-area displays:

Home theater applications

Applications that require multiple viewers

Applications in which the user needs to move about in an area

Applications where simulation of the real world is needed for training.

The requirements for each application differ in size, shape, total number of picture elements (pixels), and brightness. Requirements that are common to most applications include, a relatively large number of pixels, color, ruggedness, portability (minimum thickness and weight), reliability, low power, and affordable cost. A good display solution does not exist for these needs using present technology.

There are fundamental technical issues that impose scaling-laws and limit the size of displays that can be manufactured. These fundamental limitations are one reason why a technical solution that meets the need for large-area displays has not been achieved.

One measure of the complexity of a display device is its total number of pixels. The evolution of display technology has made newer and more complex pixel formats possible—such as VGA, SVGA, XGA, and SXGA. Increased complexity typically is accompanied by added costs. The underlying cause of this empirical complexity law is yield losses caused by random material or particle defects. These defects cause manufacturing yields to diminish as the number of pixels in the display increases.

One measure of the size of a display is its area. Costs increase exponentially with size. Each technology, LCD, PDP, EL, etc., has its own limit on maximum size. The underlying technical cause of this empirical relationship is tolerance. It is desirable to hold tight tolerances in manufacturing displays because, as the size increases, the effects of thermal expansion, humidity, residual stresses, and physical sag become more important.

Building a large-area display out of smaller tiles has been recognized as a desirable solution. Tiling is an approach that provides great flexibility for size and shape. Tiling is not subject to many of the problems that limit the size of monolithic display technologies. The complexity law does not apply because, depending on the size of the tile, the basic unit of manufacture in tiled displays is less complex than a large, monolithic multi-pixel display. The size law is not a limiting factor because the basic unit of manufacture is relatively small. Tiled displays obey a scaling-law which is not exponential but linear with display area. This fundamentally different scaling behavior is one advantage of tile technology. It reduces manufacturing costs.

What has been missing in tiled displays is a fabrication technology that allows a display to be constructed so that pixels can be brought up to the very edge (actually, within ½ pixel spacing period of the edge), while at the same time allowing for electronics to address each tile, even those tiles completely surrounded by other tiles. Two barriers to implementing the tiled approach have been: 1) eliminating the visibility of the seams between tiles, and 2) providing electrical access to the pixels.

One type of tiled display is disclosed in U.S. Pat. No. 5,644,327 entitled TESSELLATED ELECTROLUMINESCENT DISPLAY HAVING A MULTILAYER CERAMIC SUBSTRATE to Onyskevych et al., which is incorporated herein by reference for its teaching on tiled displays. This patent describes an electroluminescent display and a combination field emissive and electroluminescent display which are formed as tiles that may be joined together to provide a large-area display device. The exemplary tiles are formed using low-temperature co-fired ceramic and metal structures consisting of multiple layers of ceramic circuit-board material laminated to a metal core.

Driving circuitry for the displays is mounted on the back of the structures and vias are passed through the structure from the back to the front in order to make connection with the pixel electrodes on the front of the display device. The vias that make these connections pass between pixel positions on the display. In addition, connections are made on a pixel-by-pixel basis or for a small group of pixels. Thus, a display device according to the referenced patent may need a relatively large number of vias. The described tiles include connectors at their edges through which multiple tiles may be interconnected.

SUMMARY OF THE INVENTION

The present invention is embodied in an improved electrode structure. According to one aspect of the invention, a fluid electronic material is deposited in a precise pattern on the surface of a two-layer electrode structure. The first layer of the electrode structure designed to provide electrical contact to the fluid material and the second layer of the electrode structure formed so as to constrain the fluid electronic material in the desired pattern. Fluid electronic materials to be deposited using this aspect of the present invention may include materials which are deposited as a powder or which are deposited in a liquid phase, but later change to a solid phase.

According to another aspect of the invention, the second layer of the two-layer electrode structure includes a low surface energy material to further assist in constraining the fluid electronic material to the desired pattern.

According to yet another aspect of the invention, the conductivity of an electrode structure with a transparent section, which may be used in an electro-optical device, is improved by forming a two-layer electrode structure. The first layer of the electrode structure includes a transparent electrode material, that is coupled to the electro-optical device. The second layer of the electrode structure includes a high conductivity material that is coupled to the first layer of the electrode structure in an area away from the electro-optical device.

BRIEF DESCRIPTION OF THE DRAWINGS

FIG. 7 is a front plan view of a tile having the structure shown in FIG. 2 which illustrates an exemplary method by which electrical connections may be made to the row and column electrodes of the tile.

FIG. 8A is a cut-away view of the tile shown in FIG. 7 along the line F8A that illustrates an exemplary contact structure for a column electrode.

FIG. 8B is a cut-away view of the tile shown in FIG. 7 along the line F8B that illustrates an exemplary contact structure for a row electrode.

FIG. 9A is a top view of an exemplary electrode structure for self-alignment of liquid deposition of materials.

FIG. 9B is a cut-away view of the exemplary electrode structure for self-alignment of liquid deposition of materials shown in FIG. 9A.

FIG. 9C is a top view of an alternate exemplary electrode structure for self-alignment of liquid deposition of materials.

FIG. 9D is a cut-away view of the alternate exemplary electrode structure for self-alignment of liquid deposition of materials shown in FIG. 9C.

DETAILED DESCRIPTION

Figure 1:
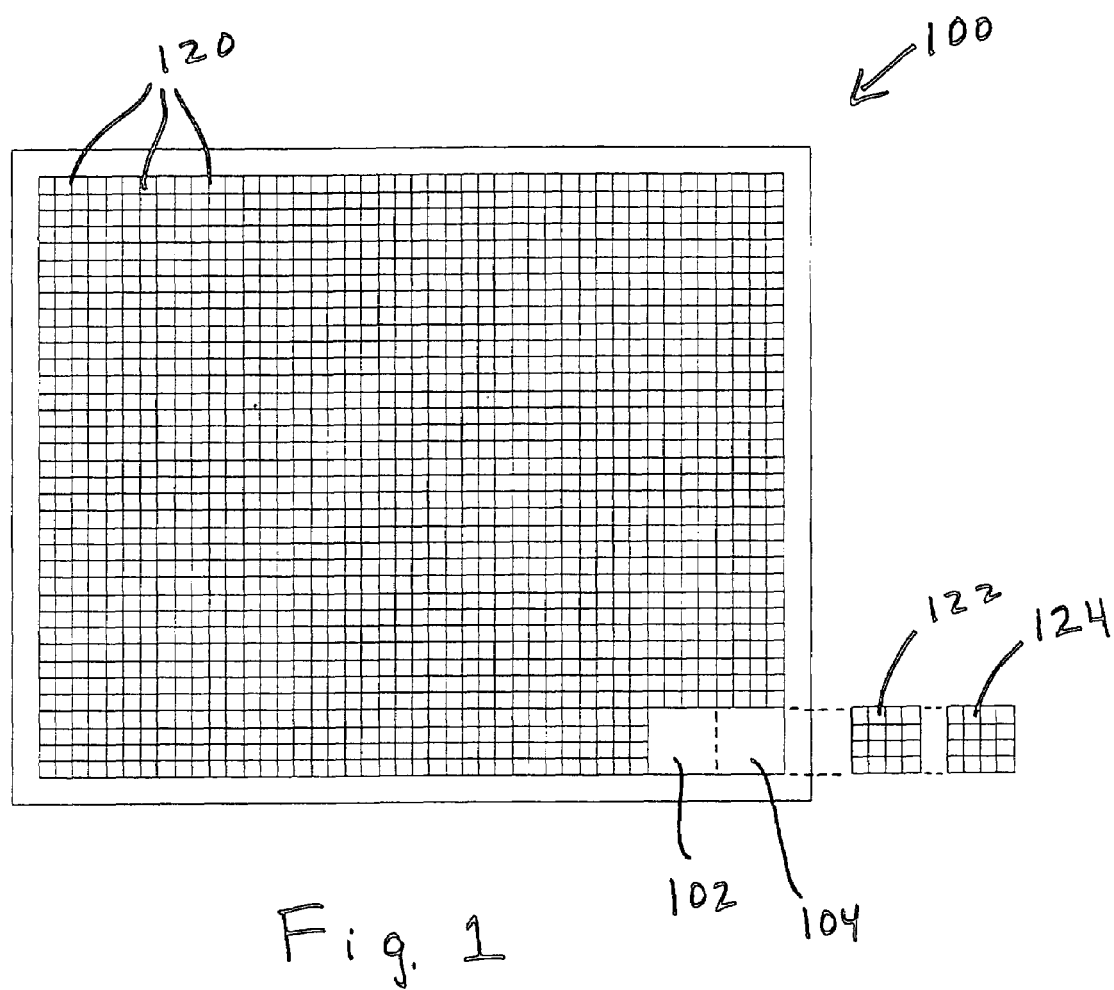
FIG. 1 is a front plan drawing of a large area display device from which two tiles have been removed.

The invention is described in terms of exemplary embodiments which are illustrated in the drawing figures. The drawing figures are not to scale. Indeed, dimensions of the drawing figures are exaggerated to aid in the description of the invention. Although the invention is described in terms of a tiled organic light emitting diode (OLED) display device, it is contemplated that it may be practiced with other tiled or non-tiled emissive display technologies such as electroluminescent, light emitting diode (LED) or plasma technology; or with tiled or non-tiled reflective display technologies such as Bistable, Reflective Cholesteric (BRC) liquid crystal technology.

FIG. 1 is a front plan view of a partially assembled large-area is display 100 according to the present invention. The display 100 is a tiled display in which emissive or reflective elements, on which the image pixels are formed, are built as relatively small arrays on tiles 120 and assembled into a frame to produce the large-area display having a large number of pixel forming elements. Alternatively, the tiles may be assembled side-to-side with their pixels aligned in rows and columns without a frame. In this instance, the individual tiles may be held together by mullions.

The tiles are constructed with pixel forming elements evenly spaced up to the edges of the tiles. The tiles are formed such that, when they are joined, the inter-pixel distance between the edge pixels of two adjacent tiles is the same as the inter-pixel distance of adjacent pixels in the interior of a tile. The display shown in FIG. 1 is missing two tiles 122 and 124. These tiles are inserted into the positions 102 and 104 to complete the display.

Although the display 100 is shown as being formed from tiles having 16 pixel forming elements in a four by four array, it is contemplated that each tile may include many more pixels. In one exemplary embodiment of the invention, described below, each tile includes 896 pixel forming elements arranged as a 32 by 28 matrix. These tile sizes are only exemplary. It is contemplated that each tile may include more or fewer pixel forming elements. In addition, it is contemplated that a single display may be formed from tiles having different numbers of pixel forming elements. For example, a display may have tiles with relatively large numbers of pixel forming elements near the center and tiles having relatively small numbers of pixel forming elements near the edges.

Figure 1A:
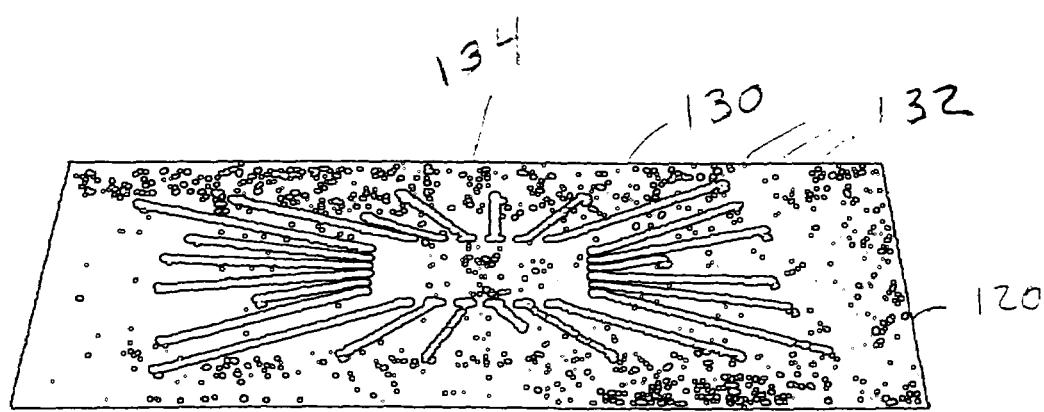
FIG. 1A is a perspective drawing of the back side of a tile suitable for use in the large area display shown in FIG. 1.
Figure 1B:
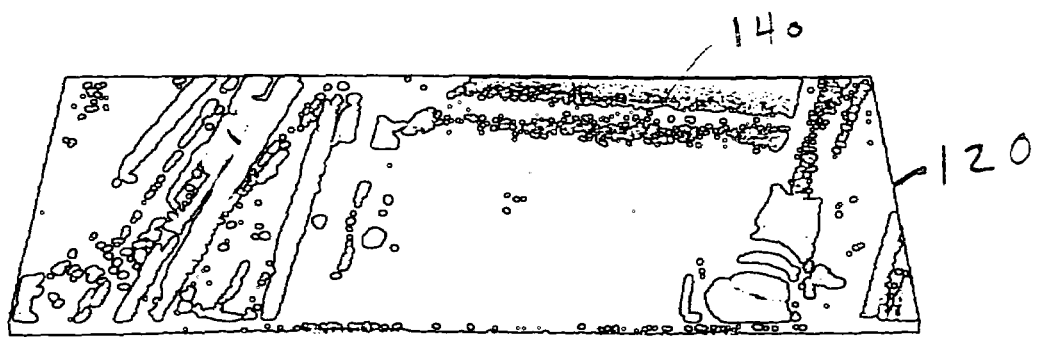
FIG. 1B is a perspective drawing of the front side of a tile suitable for use in the large area display shown in FIG. 1.

FIGS. 1A and 1B are perspective drawings showing the back and front surfaces of an exemplary tile 120. As shown in FIG. 1A, the tile includes a circuit board 130 on which is mounted at least one integrated circuit 134. The integrated circuit is connected to the pixel forming elements through conductive traces 132 on the circuit board which are coupled to vias (not shown) that extend through the circuit board to make contact with the row or column electrodes of the display device. In the tile shown in FIG. 1A, vias extend through the pixel forming elements internal to the display area, as described below with reference to FIGS. 7, 8A and 8B. Alternatively, the vias may extend through pixel forming elements along two edges of the display, as described below with reference to FIGS. 3 and 5.

In one exemplary embodiment of the invention, the pixel forming elements are made from an organic light emitting diode (OLED) material. The basic light emitting structure consists of a thin organic polymer layer sandwiched between a pair of appropriately selected and patterned electrodes. Current flowing from one electrode to the other electrode causes the organic polymer to emit light. At least one of the electrodes is desirably transparent to the emitted light. Indium tin-oxide is the usual material used for this purpose. OLED materials provide high brightness and high efficiency, and are relatively low cost materials.

An exemplary display structure according to the present invention may be formed in two parts: a display section and an electronics section. These two parts may be made separately and then joined to form a complete tile. The exemplary display section consists of a transparent glass layer on which transparent column electrodes are deposited. The OLED material is deposited onto these layers, as the active (i.e., light emitting) medium. Row electrodes are deposited as the final display layer. Additional layers such as blocking or passivation layers may be present to improve the function or life of the display layers. The transparent electrode is preferably the hole-injecting electrode and the other electrode is preferably the electron-injecting electrode. The OLED materials between the electrodes are preferably conjugated polymer materials that are applied by thick film processes, however, small molecule materials can alternatively be applied by various thin film deposition techniques. The layers are patterned so that there is electrical access to each row and column at one or more points.

As an alternative to the OLED materials, the pixel forming elements of the tiles may be any of a number of emissive devices such as electroluminescent elements, light emitting diodes, field emissive elements, plasma elements, cathodoluminescent elements or BRC LCD elements.

The electronics section is formed by punching or drilling vias through the circuit board and then printing or otherwise depositing the conductive traces on the circuit board. The conductive ink or paste used to form the conductive traces may also fill the vias. The vias make contact with the row and column electrodes of the display section when the electronics section and the display section are joined to form a tile.

Although it is not illustrated, another exemplary embodiment of the present invention includes a pixel forming structure that is appropriate for applications in which either a reflective or low power display is needed. The substrate and the electronics of this new structure are essentially the same as described below for the OLED embodiments. The display layer in this alternative embodiment, however, is a reflective display material. For example, a Bistable, Reflective Cholesteric (BRC) liquid crystal material which provides for a low power, bistable display. The disclosed tile structure enables video-rate displays in large area BRC displays. These materials switch between a planar, reflective state and a relatively transparent focal conic state. Utilizing a black backing, these two states may appear colored and black. The BRC materials offer distinct advantages for large area tiled displays: the operation between a reflecting and transparent state, combined with a black back-plane makes possible bright, high contrast displays under a variety of lighting conditions; and the bistability also allows for maintaining static images with no power applied.

One exemplary tile structure consists of a multilayer ceramic circuit board 132 that serves as a substrate upon which: the display material is mounted on the viewer side while the electronics 134 (active and passive) for drive or other functions are mounted mostly on the back side. Conductor elements 132 are printed on the individual layers to provide interconnections between the electronics and the display material, vias interconnect the conductors in different layers; and connectors are provided on the back surface to connect to external power and signal sources. The tile structure may also have a structural layer(s) such as a high softening point metal or insulator to provide freedom from distortion during the processing of the ceramic materials, and/or thermal management during the operation of the display. The tile structure also contains a transparent layer (e.g. glass) on the viewer surface to protect or contain the display material. A back panel structure is provided to mount the individual tiles and to provide electrical connection to the power and drive signals needed by each individual tile structure.

The Multilayer ceramic circuit board 130 may be formed of layers of ceramic material. The layers are first formed and processed to form vias, conductors, and other features and then assembled in a stack taking care to carefully align each layer with those layers adjacent to it. Ceramic material here is meant in the broadest sense to include ceramics, glass ceramics, glass, and other high temperature insulating materials. The multiple layers together with the connectors and vias provide the basic function of a circuit board upon which active and passive electrical devices and circuits can be placed.

The conductors 132 may be thin and/or thick film conductors formed by any of the standard processes including, for example plating, evaporation, sputtering, printing and laminating. The materials may be metals or organic conductors. The conductors may be patterned by processes that may include, for example, printing or photolithography. These conductor patterns are formed on the surfaces of the individual layers in the disclosed structure and connect to the vias to provide, according to the design of the device a means of interconnecting the electronics on and external to the disclosed structure to the display material.

Another class of conductors is used to interconnect the layers. These conductors are called vias. Via is used in the broadest sense and includes conductors that go through openings in the layer and those that go around the edge of a layer(s). Vias that go through a layer can be formed, for example, by making a hole in the layer and filling that hole with a conductor. Alternatively, pre-formed physical conductors may be imbedded in the layer. Vias that go over the edge of a layer(s) can be formed by physically placing a wire (round or flat), or array of wires, and wire bonding the ends to the surfaces to be interconnected. Alternatively vias can be formed in place by plating or other fabrication process for thick or thin film conductors.

A core layer may also be included in this structure. This layer typically has a higher softening point than the ceramic materials and serves as a substrate for the assembly and processing of the ceramic material. The core layer acts to eliminate horizontal shrinkage; establish a single coefficient of expansion for the multilayer system; and provide mechanical ruggedness to the multilayer assembly. If the layer is a good electrical conductor it may also provide RF shielding. If the layer is also a good thermal conductor, it contributes to the thermal management of the display. Conductive layers, however, present a special problem for via connections. Via connections through metal layers can be fabricated in several ways: filling the periphery of the hole with an insulating material before putting a metal conductor through the middle, or by putting the conductor only through the middle leaving space separating the conductor from the conductive metal core.

The electronics which form the image processing and pixel driving circuitry are mounted on the layers. Electronics are used in the broadest sense to include both active and passive, and both discrete devices mounted on the layers and devices formed in place by processes such as those now used to make active matrix circuits for displays on various high temperature substrates. While these electronics can be placed anywhere, the most convenient location is on the back surface of the display. This permits standard assembly and attachment equipment and processes to be used. In addition, the placing of active or passive devices on the intervening layers or viewer surface permits greater flexibility in the system design.

The display material is applied to the surface visible to the viewer. Because of the flexibility of the construction of the disclosed structure, different display materials can be used.

The edges of the tiles are desirably carefully formed to ensure that the tiled display has no visible seams between the tiles. One criterion for the tiles is that the spacing between the pixels separated by the tile seam is the same as the spacing of pixels on the tile. To satisfy this criterion, the tile edges are desirably dimensionally precise. Furthermore, if the edges are also used for conductors or if mullions are used to join adjacent tiles, it is desirable to account for the thickness of these conductors or mullions in the design and placement of the tiles.

A back panel may be provided for the physical mounting and interconnection of the tiles to form a display. The mounting of the tiles is done such that there is continuity in the pixel spacing over the display. The shape of the tiles is most typically square or rectangular, however the shape can be any shape that can be tiled to form a larger display. Also, the tile is typically flat, but may be curved along one or both dimensions to form curved or domed displays. Curved or domed displays can also be made using flat tiles mounted on a curved or domed back panel. Tiles may be attached to the back panel either by permanent connection such as soldering or using connectors, which allow the tiles to be plugged into the back panel. This latter method permits the repair and replacement of individual tiles. Different types of tiles may be attached to different areas of the back panel—for example, higher resolution areas may be placed in the center or other areas of the large display. In addition, different sized or different shaped tiles may be combined in a single display. For example, tiles near the edges of a large panel may be larger and have a lesser pixel density than tiles near the center of the panel.

The back panel may also provide the means for connecting the tiles to the operational power and data signals needed to operate the tile. Matching connectors may be provided on both the back side of the tile and the back panel to provide this connection. In the case of the data signal connections, optical connection may be used as an alternative to physical connection.

The electrical structure of the back panel provides for the distribution of power and signals to the tiles, and the electrical structure of the tiles provide for the addressing of the display pixels. Both levels of structure are described. The information needs of a tiled display increase with the size of the display as measured in total number of pixels. A greater number of pixels on a tile translates to greater amounts of data stored on the tile and greater rates of information transfer.

One advantage of the tiled display is that the scan electronics can be internal to the tile and the scan rate of any one tile is the same for a small display or for a large display. This ensures that the brightness and gray scale of the display do not degrade with increasing size. The tiled displays described in detail below have an architecture which connects the signals to the pixels without interrupting the continuity of the pixel spacing, even at the edges of the tiles. The disclosed tiled displays may also have signal processing circuitry which extracts the signal information for that tile from a broadcast information signal and transforms the extracted information into the signals needed to address that tile.

In general, the front-to-back connections include one for each row of pixels and one for each column of pixels on the tile. Tiled displays have relatively few pixels so that the number of interconnects per tile is relatively small and the yield on individual tiles can be high. This is a significant advantage of tiled displays when compared to fabrication of large displays from single substrates. In general, the yield is a function of the number of pixels in the display device.

The final connection to the row or column is made with a via that extends from the back surface of the tile. This via has a diameter less than the spacing of a pixel. To accomplish this, the portions of the vias in the display layer(s) may be made smaller than the vias through the other intervening layers, and, as described below, the connections may be staggered over the area of the tile to provide maximum spacing between the wider interconnects. These connections are the final link in the distribution of the display signals to the pixels.

Figure 2:
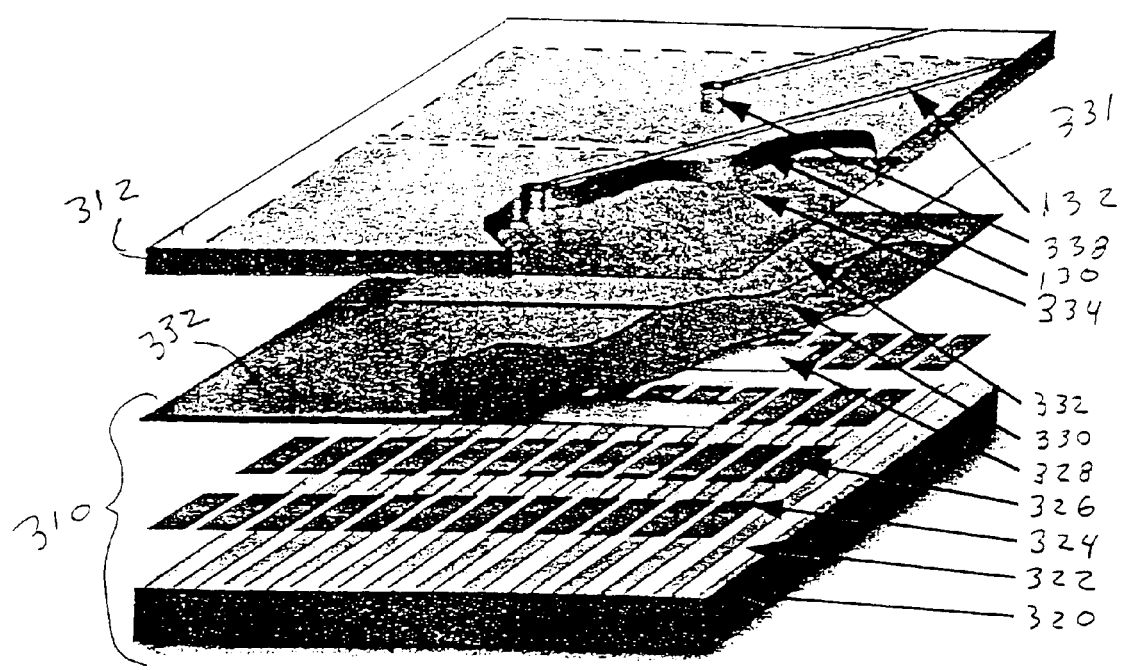
FIG. 2 is an exploded perspective drawing which illustrates a structure that may be used to implement the tile shown in FIGS. 1A and 1B.

FIG. 2 is an exploded perspective diagram which shows a first exemplary tile structure. The tile structure is formed in two parts: the display section and the electronics section.

The display section includes a transparent front plate which may be, for example, a glass plate. Transparent column electrodes 322 are formed on the front plate 320 by forming thin bands of a transparent conductor, such as indium-tin oxide, using well known processes. This may be done, for example, by depositing a film of ITO over the surface of the glass plate and selectively etching the ITO to form the electrodes. The display materials, red, green and blue OLED materials 324 and 326, including a hole transport layer, a light emitting layer and an electron injecting layer, are deposited on top of the column electrodes to define the active area of the pixels. The hole-transport layer is electrically coupled to the column electrodes, and the light emitting layer is electrically coupled to the hole-transport layer. The electron injecting layer which may, for example, be formed from metallic calcium is formed on top of the light emitting layer. The row electrodes 328 are formed on top of the electron injecting layer. As described below with reference to FIGS. 4 and 5, it is desirable for the display materials 324 and 326 to occupy only a portion (e.g. about 25 percent) of the pixel area. The row electrodes may be formed, for example, from polysilicon or from a metal such as aluminum using standard deposition techniques. An insulating layer 330 is formed on top of the row electrodes. The exemplary insulating layer 330 may be formed from any of a number of insulating materials. To protect the display materials, the insulating layer 330 is desirably formed using low-temperature processes. Exemplary materials include Polyimide or other low-temperature insulating materials. The insulating layer 330 may be applied using thick film or thin film deposition techniques. The insulating layer 330 includes a plurality of openings 331 aligned with the row electrodes 328 or column electrodes 322.

On top of the insulating layer are deposited a plurality of connecting plates 332. The plates 332 may be formed using, for example, vapor deposited aluminum or a metallic ink or paste, such as silver combined with a solvent, which is deposited using thick film processes. As described below with reference to FIGS. 7 through 8B, the connecting plates are coupled to the column electrodes 322 and row electrodes 328 by vias which extend through the openings in the insulating materials. Each of the exemplary connecting plates makes electrical contact with only one row electrode or one column electrode. To ensure that a good connection is made, however, each connecting plate 332 may connect to its corresponding row or column electrode at several locations.

The electronics section 312 includes image processing and display driving circuitry 134 (not shown in FIG. 2) a circuit board 130, which may be, for example, a thin sheet of alumina ($Al_2O_3$), deposited electrical conductors 132, connecting pads 334 and vias 338 which electrically connect the conductors 132 to the connecting pads 334 through the circuit board 130. The conductors 132, vias 338 and connecting pads 334 may all be formed using thick film deposition processes to apply a metallic ink or paste. The connecting pads 334 may also be formed from vapor-deposited aluminum. There is a one-to-one relationship between the connecting pads 334 of the electronics section and the connecting plates 322 of the display section. In the exemplary embodiment of the invention, the connecting pads 334 and the connecting plates 322 are electrically connected by applying an anisotropically conductive adhesive between the display section and the electronics section. The combined display section and electronics section forms a tile 120.

It is contemplated, however, that other methods may be used to electrically connect the connecting pads to their respective connecting plates. For example, the connecting plates 322 and connecting pads 334 may be made from a deformable material and patterned to include a portion which extends above the plane of the pad or plate. When the electronics section is mated to the display section, the patterned material on the connecting plates 322 and connecting pads 334 comes into contact and deforms, forming an electrical connection between the corresponding connecting pads and plates. The pads 334 and plates 322 may also be connected by bump-bonding techniques or using wires that are implanted in one of the pads 334 or plates 322 and engage the plate 322 or pad 334 when the electronics section 312 is mated to its corresponding display section 310.

Figure 3:
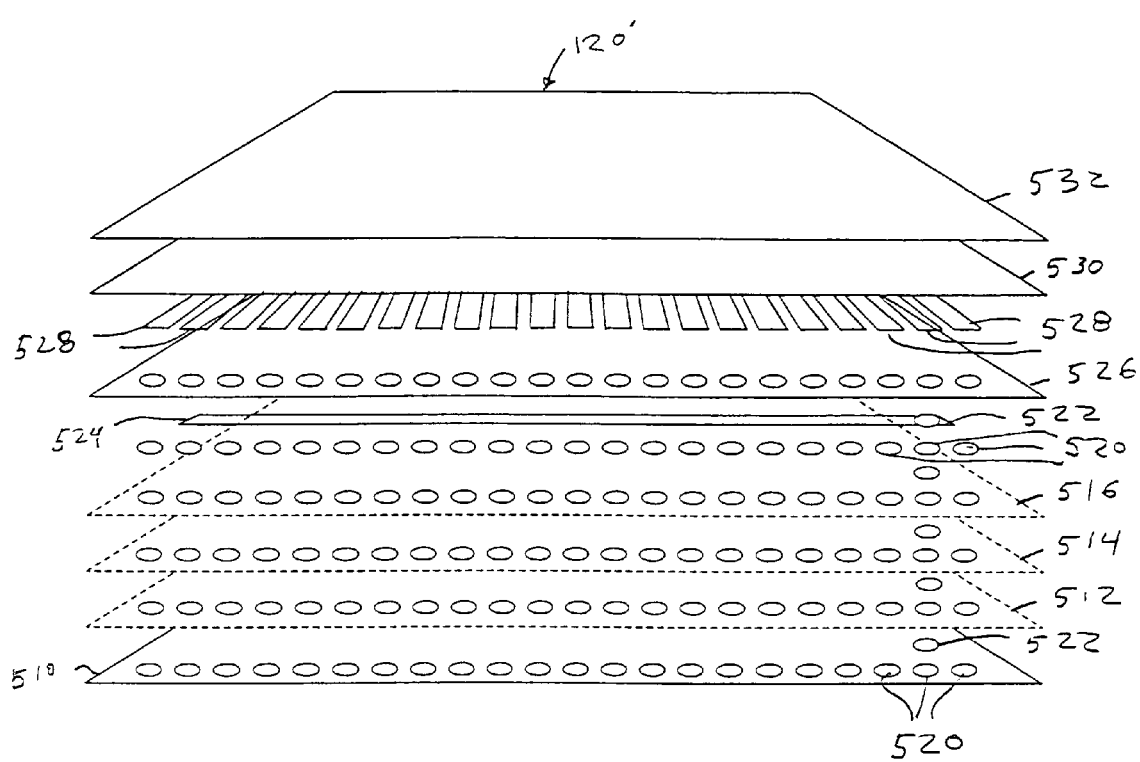
FIG. 3 is an exploded perspective drawing which illustrates an alternative structure that may be used to implement the tile shown in FIGS. 1A and 1B.

FIG. 3 is an exploded perspective drawing which illustrates an alternative structure of an exemplary tile 120. The tile shown in FIG. 3 may be formed as a separate electronics section and display section or it may be formed as a single structure. In addition, the connections to the row and column electrodes of the tile are made along two edges of the tile.

The circuit board for the tile shown in FIG. 3 is the bottom layer 510. This circuit board may include, for example, an electronics module such as the circuit 134 shown in FIG. 1A. The electronics module is coupled to the row and column electrodes of the display device through column vias 520 and row vias 522. Only one row via 522 is shown in FIG. 3. In the exemplary tile shown in FIG. 3, the circuit board is level 510 and optional levels 512, 514 and 516, shown in phantom, are interconnecting layers. These may be ceramic layers having vias to connect to higher layers and conductive traces painted or printed on one surface of the layer. If the tile structure is formed from low temperature co-fixed ceramic and metal (LTCCM) materials, one of the layers 512 or 514 may be a metal or insulating structural substrate. Layer 516 is a ceramic layer having column vias 520 and row vias 522. The row vias formed on the ceramic layer 516 connect to the row electrodes 524 of the exemplary display tile.

If the tile shown in FIG. 3 is formed from separate electronics and display sections, then the electronics section includes only the layer 510 and the optional layers 512, 514 and 516. If the tile is formed as a single piece then the display material 526 is deposited on top of the row electrodes 524. In the drawing FIG. 3, the display material 526 is illustrated as a solid sheet. This material, however, may include patterned electron-injecting layers and patterned OLED cells deposited on the row electrodes. Using distinct patterned cells of display material, physically and electrically separate from neighboring cells, increases display contrast by greatly reducing both electrical and optical crosstalk between pixels, and sub-pixels. As described above with reference to FIG. 2, the row electrodes may be formed from a metal such as aluminum or from polysilicon.

The column electrodes 528 are formed on top of the display material 526. The column electrodes are connected to the circuit board through the vias 520 which extend through each level of the display tile from level 510 through level 526. Each column electrode is coupled to a respectively different via 520. As in the tile structure shown in FIG. 2, the column electrodes 528 are typically is formed from a transparent conductive material such as indium-tin oxide (ITO). Conductivity of the column electrodes may be improved by depositing a second, more highly conductive, but opaque, electrode layer on top of the ITO layer, outside of the active pixel areas. Further discussion of this techniques is provided with regard to FIGS. 10B–E below. In the exemplary embodiment of the invention, level 530, formed above the column electrodes 528 may be an optical filter or it may be a patterned black matrix which covers the inactive areas of the display layer 526 with black lines while providing openings for the active elements of the display material. The final layer of the display tile shown in FIG. 3, is a glass front cover 532.

If the tile shown in FIG. 3 is formed as separate electronics and display sections, then the display section may be formed, as described above with reference to FIG. 2. First, the filter or black matrix layer 530 is deposited on the glass cover 532. Next, the transparent column electrodes 528 are deposited, then the OLED materials are formed on the column electrodes and the row electrodes 522 are formed to cover the OLED materials. The exemplary separate electronics and display sections shown in FIG. 3 may be joined by bump-bonding the row and column vias along their edges or by inserting conductive elements, for example wires, into the row and column vias on one of the sections such that the conductive elements protrude from the vias. The conductive elements would then mate with the corresponding vias on the other section when the sections are joined.

The tile structure shown in FIG. 3 may be formed by first preparing green tape blanks for the layers 510, 512, 514 and 516. Next, the blanks are punched with holes through which the vias 520 and 522 will be formed. After the blanks are punched, they may be painted or printed with suitable conductive material to fill in the vias and to provide any conductive traces which may be needed to interconnect other circuitry in the display tile. The traces printed on the green tape sheet 516 may include the row electrodes 524. This structure including layers 510, 512, 514 and 516 as well as the vias 520 and 522 and the row electrodes 524 is then laminated and fired to form a ceramic substrate for the circuit component of the display device. Next, the display materials 526 are deposited on the row electrodes 524. After depositing the display material 526, the column electrodes are formed on the tile using conventional processes for depositing ITO.

In a separate step, the black matrix or filter 530 may be formed on the glass cover 532. The combined mask and cover is then aligned with the display device such that the openings in the mask correspond to the active pixel regions of the display material. The glass cover 532 is then sealed to the composite fired ceramic structure using, for example, a frit glass.

Figure 5:
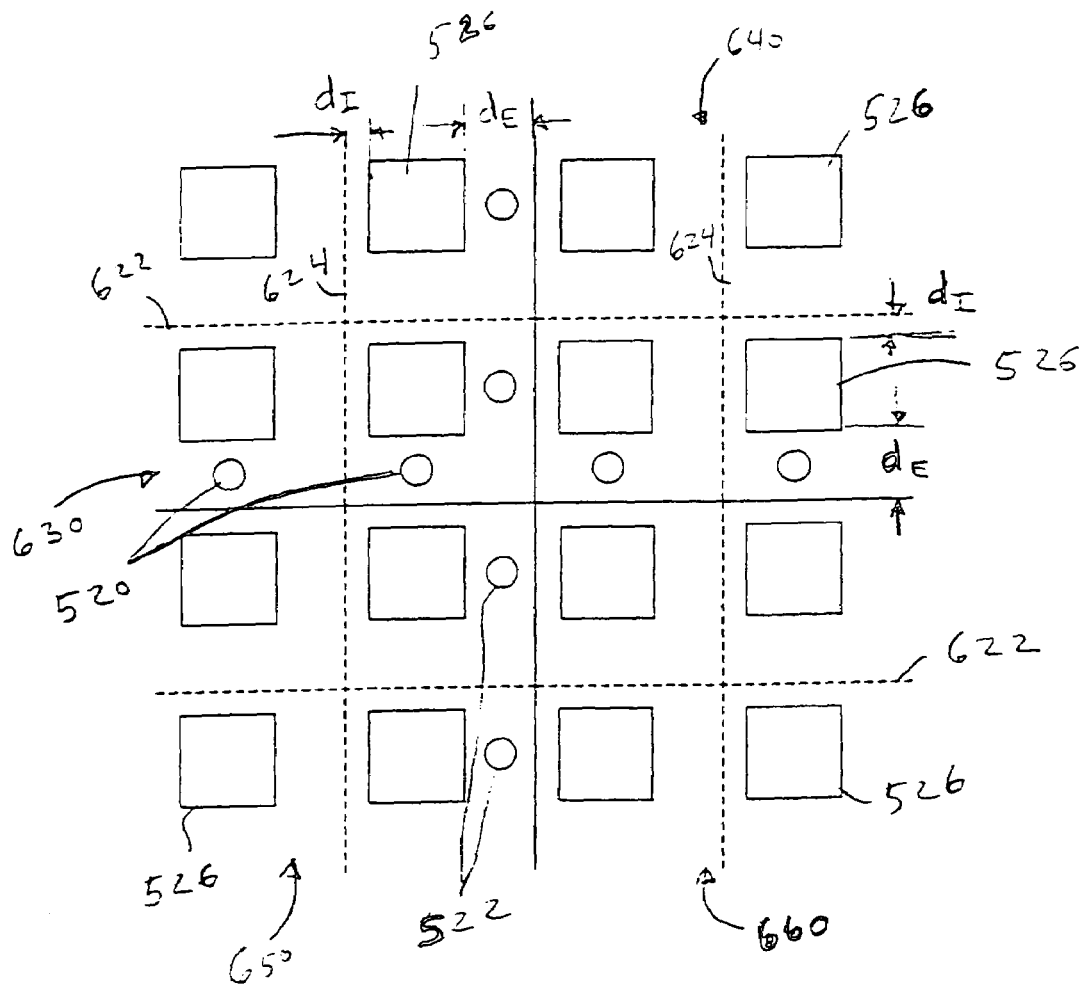
FIG. 5 is a pixel diagram which shows an exemplary pixel layout for portions of four tiles having the structure shown in FIG. 3.

FIG. 5 is a pixel diagram which illustrates an exemplary pixel spacing that may be used in the tile shown in FIG. 3. This pixel spacing allows the conductive vias to be arranged along the edge of the tile, without locally distorting the inter-pixel distance in the assembled tiled display. FIG. 5 illustrates portions of 4 tiles, 630, 640, 650, and 660. The dashed lines 624 and 622 illustrate pixel boundaries. These lines are provided only as a guide in understanding the pixel layout. The active portion 526 of the pixels occupies only about ¼ of the total pixel area. This defines a pixel aperture of approximately 25%. In this exemplary embodiment of the invention, the active region is not centered in the pixel area but is offset to the left and top as shown in FIG. 5.

As shown in FIG. 5, this spacing of the pixels leaves room along the edges of the display for the vias 520 and 522 to connect to the row and column electrodes of the pixel without interfering with the regular spacing of the pixels across tile boundaries. In the exemplary embodiment shown in FIG. 5, the distance $d_e$, which is the distance from the active region 526 to the edge of the tile, is approximately twice the distance $d_I$ which is the internal distance from the edge of the active area of the pixel 526 to the pixel boundary 622 or 624.

Although the pixel diagram shown in FIG. 5 has the active region of the pixel being offset both horizontally and vertically, it is contemplated that the active area may be offset only vertically. In this configuration, the contacts to the row electrodes are beneath the active pixel material and, thus, do not need to offset the active region of the pixel.

Figure 4:
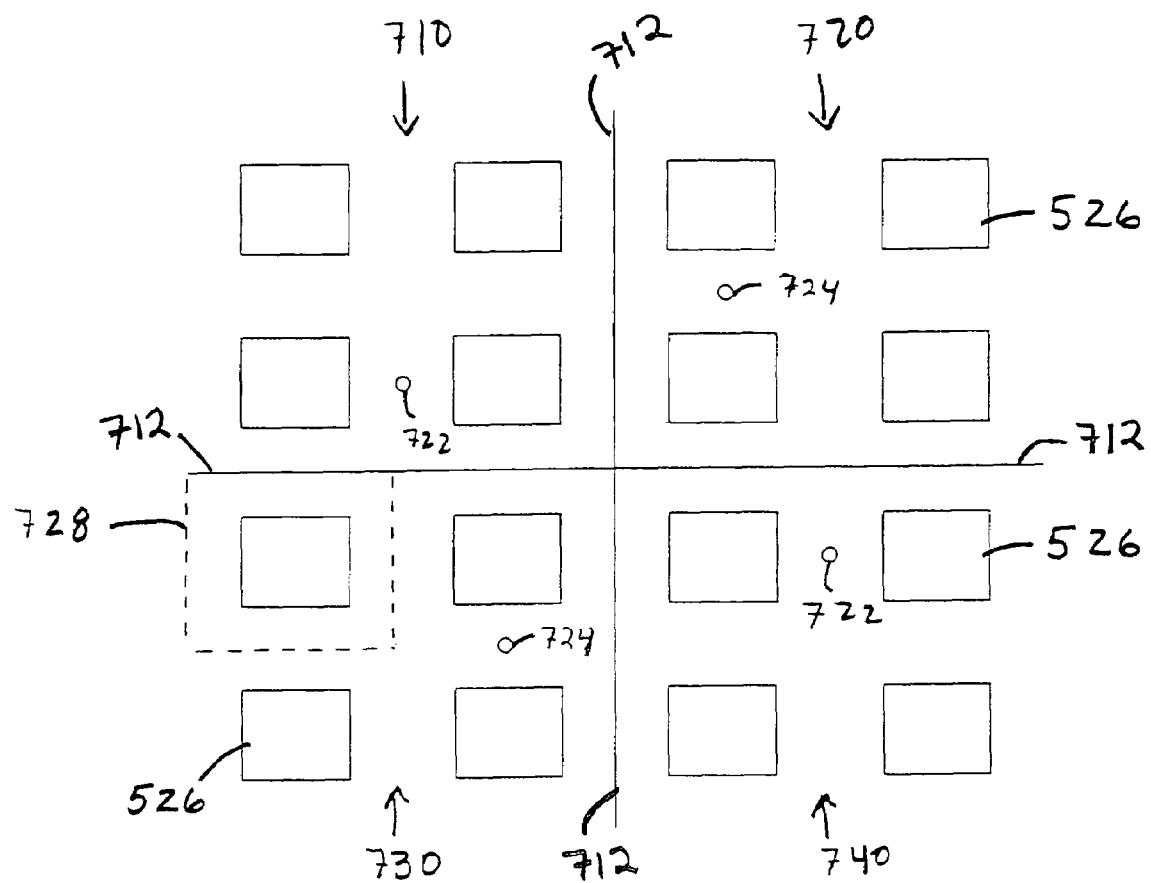
FIG. 4 is a pixel diagram which shows an exemplary pixel layout for portions of four tiles having the structure shown in FIG. 2.

FIG. 4 is an alternative pixel layout, suitable for use for a tile such as that shown in FIG. 2. In the layout shown in FIG. 4, the active portions 526 of the pixels are centered in their respective pixel regions and the vias which connect the row and column electrodes of the display to the electronics are formed between respective pixel elements. The distance between the edge of an active region 526 and the edge 712 of the display is equal on all sides of the tile and the distance from the center of the active pixel region to the edge is ½ of the pixel pitch. However, the distance between the center of an edge pixel and the edge of the tile may be slightly less than ½ of the pixel pitch in order to allow a mullion to be inserted between adjacent tiles. Mullions are typically used both to join tiles on the display device and to hide the edges where the tiles meet.

Figure 6A:
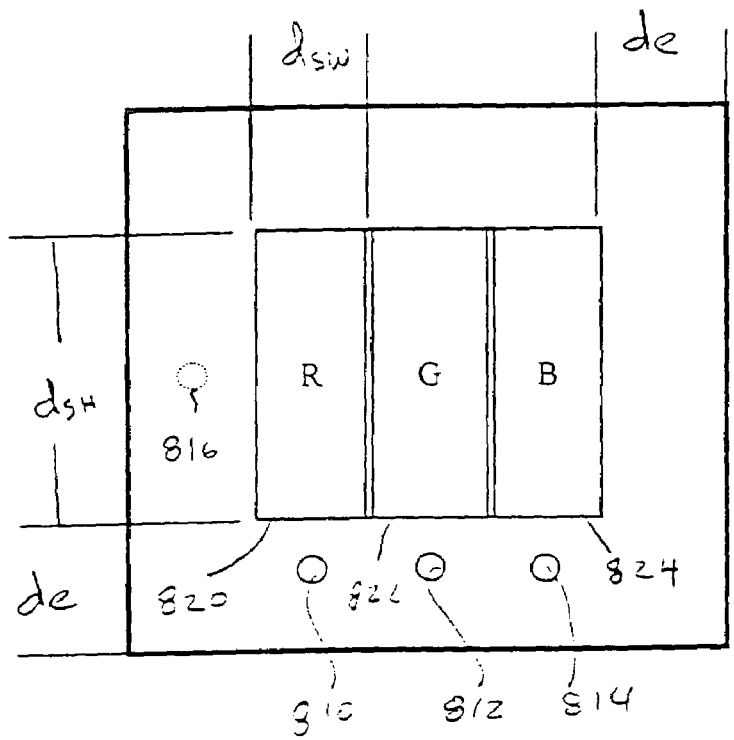
FIG. 6A is a front-plan view of a single color pixel structure which includes separate sub-pixels.
Figure 6B:
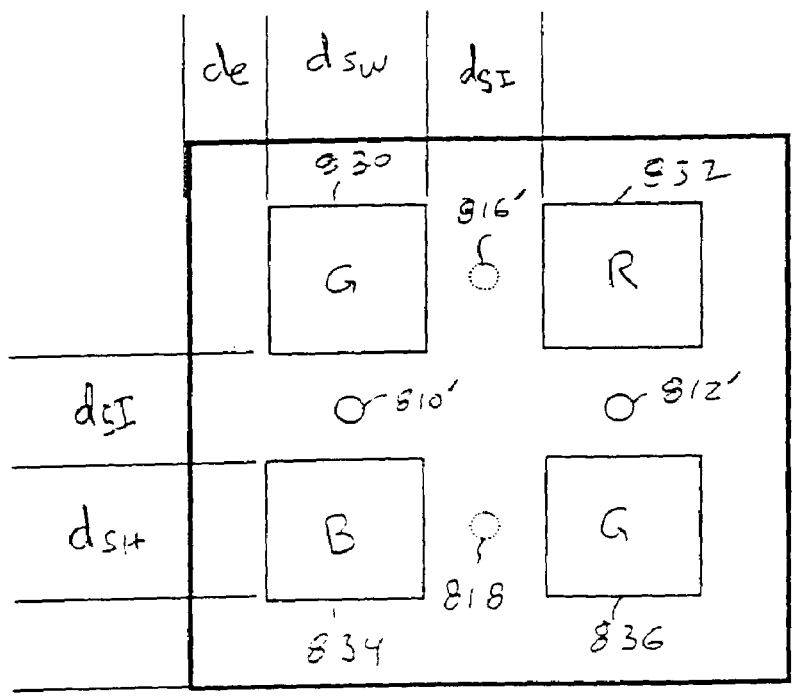
FIG. 6B is a front-plan view of an alternative single color pixel structure which includes separate sub-pixels.

The displays described above have been, in general, monochrome displays. The pixels have a single emissive area which is controlled by a single row and column electrode pair. Color pixels may be implemented as shown in FIGS. 6A and 6B. FIG. 6A shows a single pixel having separate red (R) 820, green (G) 822 and blue (B) 824 sub-pixels. The three sub-pixels 820, 822 and 824 each has a respective column electrode (not shown) which is connected to the electronics section by the vias 810, 812 and 814, respectively. A single row electrode (not shown) is used by all three of the sub pixels. This row electrode is coupled to the electronics section by the via 816, shown in phantom. The geometry of the triple sub-pixel structure is defined by $D_{SH}$, the height of the sub-pixel, $d_{SW}$, the width of the sub-pixel, and $d_e$, the distance from the active sub-pixel areas to the edge of the pixel area. For one exemplary embodiment of the invention, these dimensions are given in Table 1 in terms of the pixel pitch, P.

TABLE 1

| | |
|---|---|
| $d_{SH}$ | .5 P |
| $d_{SW}$ | .16 P |
| $d_e$ | .25 P |

It is also contemplated that the width of different color sub-pixels may vary to compensate for differences in brightness.

FIG. 6B illustrates an alternative color pixel structure. This structure includes four sub-pixel elements, 830, 832, 834 and 836. Two of these sub-pixel elements, 830 and 836 emit green light when stimulated while the other two pixel elements, 832 and 834 emit red and blue light, respectively. This structure is known as a quad sub-pixel structure. The structure uses two green sub-pixels because more of the luminance information in a color display is in the green pixels than is in either of the red or blue pixels. Thus, the use of two green sub-pixels allows for a brighter display. Alternatively, the pixels 830 and 836 may be both red or blue pixels. In some display technologies, the amount of light emitted by the red or blue pixel material may be less than the amount of light emitted by the green pixels. In this instance, making the pixels 830 and 836 both red or both blue pixels, respectively, would improve the overall brightness of the display. The pixel structure shown in FIG. 6B employs two row electrodes (not shown) and two column electrodes (not shown). The row electrodes are coupled to the electronics section by the vias 816' and 818 (shown in phantom) while the column electrodes are coupled to the electronics section by the vias 810' and 812'. The geometry of the quad sub-pixel structure is defined by the dimensions $d_{SH}$, the height of the sub-pixel, $d_{SW}$, the width of the sub-pixel, $d_e$, the distance from the active sub-pixel areas to the edge of the pixel area, and $d_{SI}$, the distance between adjacent sub-pixels. These values are defined in Table 2 for the exemplary embodiment of the invention.

TABLE 2

| | |
|---|---|
| $d_{SH}$ | .25 P |
| $d_{SW}$ | .25 P |
| $d_e$ | .125 P |
| $d_{SI}$ | .25 P |

While FIGS. 6A and 6B show the distances $d_e$ and $d_{SI}$, as being equal in the horizontal and vertical directions, it is contemplated that these values may be different. The exemplary pixel structures shown in FIGS. 6A and 6B both have active pixel areas covering approximately 25 percent of the pixel area to produce a pixel aperture of approximately 25 percent. This value is exemplary only. The invention contemplates both larger and smaller pixel apertures.

As described above with reference to FIGS. 2, 6A and 6B, the electronics section of the assembled tile includes connecting plates 332 which form electrical connections to individual row or column electrodes across the area of the display tile. FIGS. 7, 8A and 8B illustrate an exemplary manner in which these connections may be made. FIG. 7 is a front plan view of an exemplary tile with the connecting plates 332 shown as dashed line boxes. The insulating layer 330 has been removed for clarity. FIG. 7 also includes two row electrodes 328A and 328B and two column electrodes 322A and 322B. Column electrode 322A is shown as being connected to connecting plate 332A through the vias 914. Column electrode 322B is shown as being connected to connecting plate 322D through the vias 916. Row electrodes 328A and 328B are coupled to the respective connecting plates 332B and 332C through the vias 910 and 912 respectively.

FIGS. 8A and 8B show cutaway views of a portion of the electronics section shown in FIG. 7 along the lines F8A and F8B respectively. FIGS. 8A and 8B include the insulating layer 330 which was omitted from FIG. 7. As shown in FIG. 7, the connections 916 to the column electrodes 322B are made on a region of the display tile which is between active pixel elements. Thus, FIG. 8A shows only the glass substrate 320, the column electrodes 322, the insulating layer 330, and the connecting plates 332D and 332E. The via 916 between the connecting plate 332D and column electrode 322B is made through the opening 331 in the insulating layer 330. This connection may be made for example, when the connecting plate is printed on the electronics section by allowing the silver paste or ink used in the printing process to flow through the opening 331 and make contact with the column electrode 322B.

FIG. 8B illustrates an exemplary method for making connections to the row electrodes. As shown in FIG. 7, the connections to the row electrodes are made on a portion of the display containing the active pixel elements 324. The segment of the display shown in FIG. 8B includes the glass substrate 320, transparent column electrodes 322 display material 324 and row electrode 328B. As shown in FIG. 7, the connecting plate 332B makes connection with the row electrode 328B using the vias 910. This connection is made through the openings 331 in the insulator 330. As shown in FIG. 8B, there are several openings such that connection between the connecting plate 332B and row electrode 328B may be made at several locations. These multiple openings provide redundancy which increases yield in the completed display tiles. Although FIG. 8B shows the connection between the connecting plate 332B and row electrode 328B being made in the space between respective pixels 324, it is contemplated that these connections may be made anywhere along the row electrode 328B and need not be limited to spaces between active pixel elements.

Although not shown in FIG. 8A, the connections to the column electrodes are also made at a plurality of locations along the connecting plates. Referring to FIG. 7, for example, there are three vias 916 representing connections between the connecting plate and 332D and the column electrode 322B.

Because each connecting plate makes electrical contact with only one row electrode or column electrode, it is desirable for the number of connecting plates implemented in a display tile to be greater than or equal to the sum of the number of columns and the number of rows in the tile. In an exemplary tile according to the subject invention, there are 28 rows and 32 columns of pixel elements. Thus, there should be at least 60 connecting plates and connecting pads in the tile display section and the tile electronic section. There are a total of 896 pixel positions on the exemplary tile. To allow for good isolation among the respective connecting plates and connecting pads, each connecting plate may cover up to 12 pixel positions arranged in a 2 by 6 matrix. Because the locations at which connections may be made to the column electrodes are more limited than the locations at which connections may be made to the row electrodes, the exemplary connecting plate may cover 2 row pixel positions by 6 column pixel positions, as shown in FIG. 7. In another exemplary embodiment, it may be desirable to implement small connecting pads, each less than a single pixel area, to reduce capacitance within the circuit board structure.

Because ITO is not as good a conductor as aluminum or silver, there may be resistive voltage drops along the column electrodes from the locations at which the electronics module 134 is connected to the column electrode. To reduce the magnitude of these resistive voltage drops, it may be desirable to connect the electronics module to each column electrode at several spaced points along the column electrode. Because these points are desirably not adjacent, it may be desirable to allocate two or even three connecting plates 332 for each column electrode 322. Thus, the number of connecting plates 332 and connecting pads 334 may be greater than the sum of the number of row electrodes and column electrodes.

In an alternate exemplary embodiment, described below with reference to FIGS. 10B–E, the conductivity of ITO column electrodes may be improved by adding a second, high conductivity, electrode layer in regions outside of the active pixel area. It is desirable for this second electrode layer to have high conductivity and form low resistance contacts with the ITO. Numerous materials may be used to form the second electrode layer, among them polysilicon, chromium, silver, gold, and aluminum. Alloys of these materials may also be used. Multiple sub-layers may also be used for this second electrode layer to further enhance the contact resistance. Second layers formed from sub-layers of first titanium-tungsten topped with aluminum; palladium topped with aluminum; and titanium topped with aluminum are among the possible combinations.

A similar two-layer electrode structure may be designed to have a further advantage in the construction of OLED display devices. OLED materials are often deposited while they are in a liquid state. A number of techniques exist to create patterns in materials deposited in a liquid state, such as ink-jet printing, transfer printing, silk screening, stamp printing, and pin-transfer printing.

Obtaining precise patterns for materials formed using such standard liquid deposition techniques, such as OLED materials, liquid crystal materials and color filter materials, is usually difficult. If the second electrode layer of a two-layer electrode structure is patterned to substantially surround the active pixel areas, as illustrated in FIGS. 9A–D, then the second electrode layer may function as a levee to contain the OLED material during deposition. The reduction in inter-pixel crosstalk resulting from the physical separation of the display material is advantageous in display and detector technologies. In the case of liquid crystals, or other liquid electronic materials which remain liquid after deposition, the second electrode layer would desirably have a top sub-layer composed of an insulating material, allowing the other electrode of the pixel structure to be formed in direct contact with the insulating sub-layer, thereby encapsulating the liquid.

The second layer of the two layer electrode in this embodiment may be conductive, but this is not necessary. This is particularly true when the electrode structure may be opaque, and is designed primarily for alignment of liquid materials. In this case, it may also be desirable for the first electrode layer to be reflective, especially when the liquid material being deposited is a liquid crystal material.

FIG. 9A illustrates an exemplary electrode structure which may be used to help with self-alignment of liquid deposition of materials. The electrode structure contains two layers, a first electrode layer 2101 and a second layer 2102. The first layer 2101 may be a transparent electrode such as ITO or it may be composed of a metal or organic conductor. The second layer is deposited on top of the first layer leaving exposed those regions of the first electrode layer where it is desirable to deposit liquid materials. It is also noted that the second layer of this exemplary electrode need not be a conductor. Further, the second layer may be formed from a number of sub-layers. These sub-layers may be conductors or insulators. The outer sub-layer, or the entire second layer 2102, may desirably be a low surface energy material, such as polyamide or Teflon, to assist in confinement of the liquid materials being deposited.

FIG. 9B is a cut away view of the electrode structure shown in FIG. 9A along line B from FIG. 9A. In this view, the second layer of the electrode structure 2102 can be seen on top of the first electrode layer 2101. Numerous methods for deposition of these layers may be employed, whereby the second layer may be suitably patterned to confine the display material during deposition.

FIG. 9C shows an alternate embodiment of the electrode structure demonstrated in FIGS. 9A and 9B. This embodiment includes both the first electrode layer 2101 and the second layer 2102. Also seen in this embodiment is a gap 2103 on one side of the second layer. Confinement of liquid materials deposited on this electrode may still be accomplished due to the surface tension of the liquid materials. Confinement can be further assured by the proximity of the neighboring electrode or by coating the areas between the electrodes with a low surface energy material. It can be seen that, in the illustrated embodiment, the outside electrode 2105 does not contain such a gap. It is contemplated, however, that the outside electrode may have gaps. It is also noted that in the embodiment illustrated in FIG. 9C the gaps are all shown on the right side of the electrodes, but that the gaps are not necessarily on the same side of the electrodes.

FIG. 9D is a cut away view of FIG. 9C seen from line D in FIG. 9C. This view demonstrates the orientation of the first electrode layer 2101 and the second electrode layer 2102 which has been deposited on top of the first electrode layer.

Once the electrode structure has been formed, the liquid electronic material may be deposited on the electrode structure with any standard liquid deposition method. It is contemplated that the technique and structures described above with regard to FIGS. 9A–D may be employed in combination with the electrostatic deposition technique described in U.S. patent application Ser. No. 09/250,328. Such compound electrode structures may also prove helpful during other deposition techniques, such as powder deposition.

It should be noted, with regard to the exemplary electrode structures illustrated in FIGS. 9A–D, that if the second layer 2102 is conductive and electrically coupled to the first electrode layer, then the first electrode layer 2101 does not need to be continuous. This attribute may be particularly advantageous in the case where the material of the first electrode layer exhibits an undesirable property, such as mechanical instability or poor conductivity. Alternatively the first electrode layer may be continuous and the second discontinuous.

Figure 10:
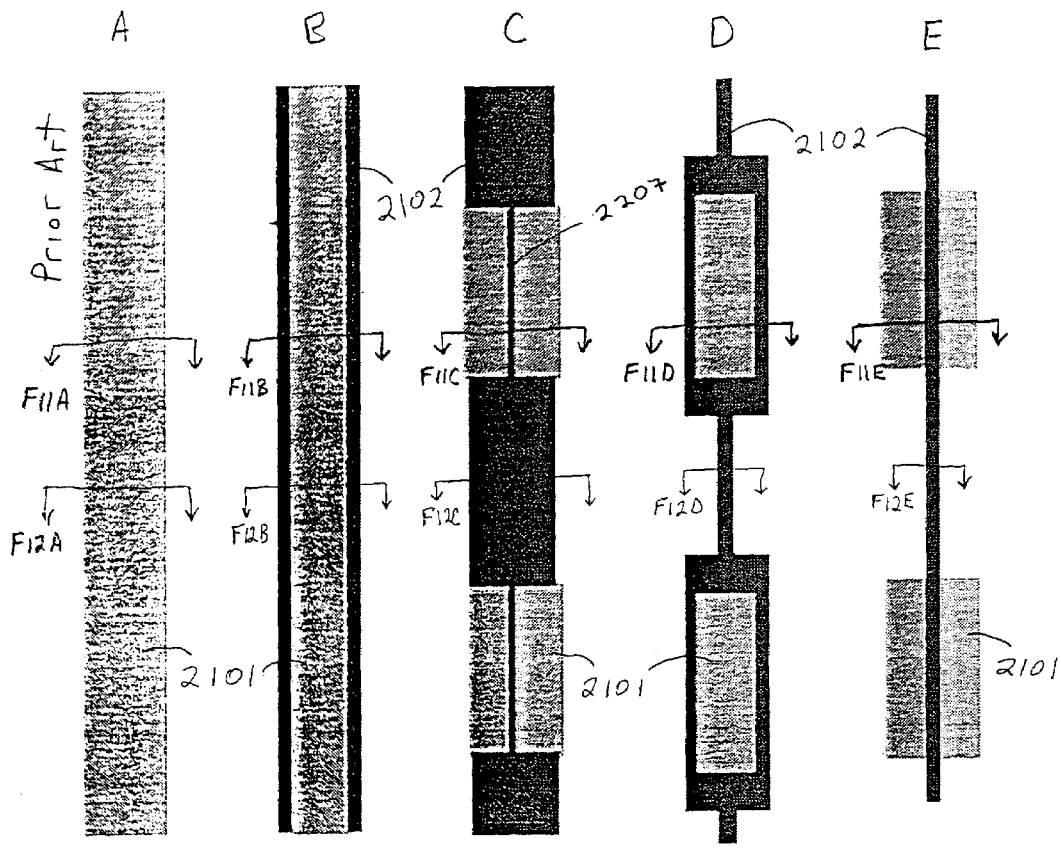
FIG. 10A is a top view of a single layer electrode.
FIG. 10B is a top view of an exemplary two-layer electrode. This two-layer electrode has a central transparent region and rails for improved conductivity.
FIG. 10C is a top view of an exemplary two-layer electrode. This two-layer electrode has a central transparent region and a second electrode layer for improved conductivity.
FIG. 10D is a top view of an exemplary two-layer electrode. This two-layer electrode has transparent island regions and a second electrode layer for improved conductivity.
FIG. 10E is a top view of an exemplary two-layer electrode. This two-layer electrode has transparent island regions and a second electrode layer for improved conductivity.

FIGS. 10A–E illustrate five exemplary transparent electrodes. The first exemplary transparent electrode FIG. 10A is composed of a single transparent electrode layer 2101. This transparent electrode may be formed from tin oxide, indium-tin oxide, a thin metal such as gold or calcium, or a conductive polymer such as polyaniline. This configuration is an example of the prior art. A shortcoming of this design is the poor conductivity which is characteristic of transparent electrodes, as was discussed above with regard to the column electrodes 322 in FIG. 2. It is proposed, herein, that each column electrode be coupled to several vias and that these vias then be coupled together by a series of more conductive connecting plates 332 to help alleviate this column electrode conductivity problem.

FIG. 10B demonstrates an exemplary embodiment of the present invention which may be used to increase the overall conductivity of the transparent conductive traces. In this electrode, the transparent electrode layer 2101 has been augmented by a second electrode layer 2102 which has been deposited along one or both edges of the transparent electrode in a rail configuration. The second electrode layer includes a material with a higher conductivity than the transparent electrode layer, as well as desirably having a work function that approximates the work function of the first transparent electrode layer and thus provides low contact resistance. The second electrode layer may be composed of several sub-layers if that is desirable to accomplish improved work function matching. A number of appropriate second electrode materials have been listed above. The second electrode layer may also contain exposed sub-layers formed of low surface energy materials to assist in deposition of liquid materials upon the electrode if this is desired as well. Employing a two layer electrode structure as illustrated in FIG. 10B as the transparent column electrode 322 in the video tile of FIG. 2 provides many advantages. Among these advantages are simplification of the circuit board 130 and layout of connecting pads 332 and 334, as well as reducing the number of vias used to connect the column electrodes to the electronics section of the display. These advantages are even more useful for the single substrate video tile described above with reference to FIG. 3. In the embodiment shown in FIG. 10B the two electrode layers 2102 and 2102 may be formed on the same level and electrically coupled perpendicular to the substrate surface rather than parallel to the substrate surface.

FIG. 10C illustrates another embodiment of the present invention. The electrode in FIG. 10C demonstrates a masking method in which the second electrode layer 2102 has been used to mask off sections of the first transparent electrode layer 2101. In this embodiment, the first transparent electrode layer may be either continuous, extending underneath the second electrode layer in the regions which have been masked, or it may be composed of islands of transparent electrode material. In this exemplary embodiment the lines 2207 of the second electrode layer, which extend across the open regions of the transparent first electrode layer, are desirably small enough to be rendered invisible by diffraction and reflection of light passing through the transparent electrode layer. By running lines 2207 down the middle of the window of transparent electrode material this exemplary embodiment of the present invention more effectively lowers the resistance across the entire transparent window more effectively than a single rail along one side would. An electrode of this exemplary also has the advantage of moving the second electrode layer away from the edge of the transparent window, allowing electro-optical structures in neighboring rows to be placed closer together without shorting.

An embodiment related to FIG. 10C is also contemplated in which the lines 2207 are omitted. In this embodiment the two electrode layers 2102 and 2102 may be formed on the same level and electrically coupled perpendicular to the substrate surface rather than parallel to the substrate surface.

The exemplary embodiment shown in FIG. 10D features islands of the first transparent electrode material 2101, which are surrounded by, and connected to the second electrode layer 2102. This embodiment of the present invention not only allows for improved conductivity of a transparent electrode but also is useful in assisting in the liquid deposition of materials, such as color filters or display material formed on the transparent electrode material 2101.

FIG. 10E shows an island structure as well. In this embodiment the first transparent electrode layer 2101 is deposited in islands and then a second electrode layer 2102 is deposited in a narrow strip running down the middle of the islands and connecting them. In this embodiment, it may be desirable for the strip to be narrow as in the embodiment shown in FIG. 10C, though this is not a requirement. Additionally, it is contemplated that the second electrode strip 2102 of the exemplary embodiment shown in FIG. 10E need not be straight, nor must the islands lie along a line. This approach may be desirable for connecting sub-pixels with a pixel structure.

Another property of ITO and other transparent electrode materials that may sometimes prove a disadvantage is light piping by internal reflections within the material. Breaking up the transparent electrode into small sections and inhibiting this light piping may be an additional advantage of the island configuration in some applications, such as video display systems or optical sensor system.

Figure 11:
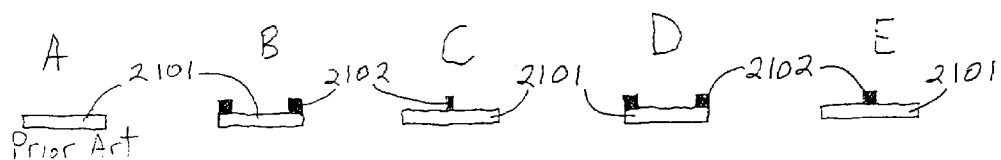
FIG. 11A is a cut-away view of the single layer electrode shown in FIG. 10A.
FIG. 11B is a cut-away view of the exemplary two-layer electrode shown in FIG. 10B.
FIG. 11C is a cut-away view of the exemplary two-layer electrode shown in FIG. 10C. This cut-away view is from a portion of two layer electrode which would contact an electro-optical device.
FIG. 11D is a cut-away view of the exemplary two-layer electrode shown in FIG. 10D. This cut-away view is from a portion of two layer electrode which would contact an electro-optical device.
FIG. 11E is a cut-away view of the exemplary two-layer electrode shown in FIG. 10E. This cut-away view is from a portion of two layer electrode which would contact an electro-optical device.

FIG. 11A shows a cut-through view of the prior art structure, shown in FIG. 10A, as seen from line F11A.

FIG. 11B shows a cut-through view of FIG. 10B as seen from line F11B. Although the second electrode layer 2102 is shown on top of the first transparent electrode layer 2101 in FIG. 11B, it would be understood by one skilled in the art that, in this embodiment, the second electrode may extend over the edges of the first electrode or may reside on the same level of the first electrode contacting it horizontally rather than vertically. These differences do not affect the electrical performance of electrodes constructed according to this embodiment.

FIG. 11C shows a cut-through view of FIG. 10C as seen from line F11C. The second electrode layer 2102 is shown on top of and centered on the first transparent electrode layer 2101 in FIG. 11C. It would be understood by one skilled in the art that, in this embodiment, the second electrode need not be centered on the first electrode and that such a change does not affect the electrical performance of electrodes constructed according to this embodiment.

FIG. 11D shows a cut-through view of FIG. 10D as seen from line F11D. As in FIG. 11B the second electrode layer 2102 is shown on top of the first transparent electrode layer 2101 in FIG. 11D. As described above in reference to FIG. 11B, the second electrode may extend over the edges of the first electrode or may in fact reside on the same level of the first electrode contacting it horizontally rather than vertically in this embodiment.

FIG. 11E shows a cut-through view of FIG. 10E as seen from line F11E. As in FIG. 11C the second electrode layer 2102 is shown on top of and centered on the first transparent electrode layer 2101 in FIG. 11E. Again, it would be understood by one skilled in the art that, in this embodiment, the second electrode need not be centered on the first electrode and that such a change does not affect the electrical performance of electrodes constructed according to this embodiment.

Figure 12:
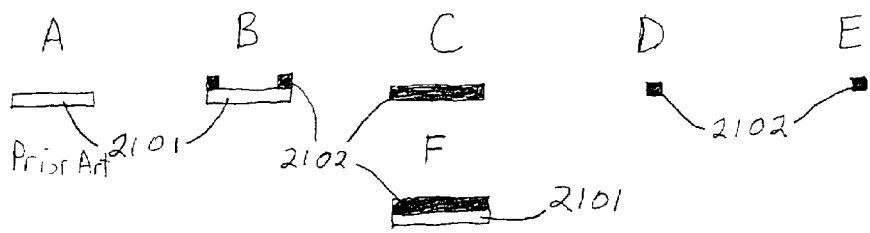
FIG. 12A is a cut-away view of the single layer electrode shown in FIG. 10A.
FIG. 12B is a cut-away view of the exemplary two-layer electrode shown in FIG. 10B.
FIG. 12C shows a cut-away view of the exemplary two-layer electrode shown in FIG. 10C in an island configuration as seen from a location which would not contact an electro-optical device.
FIG. 12D is a cut-away view of the exemplary two-layer electrode shown in FIG. 10D. This cut-away view is not from a portion of two layer electrode which would contact an electro-optical device.
FIG. 12E is a cut-away view of the exemplary two-layer electrode shown in FIG. 10E. This cut-away view is not from a portion of two layer electrode which would contact an electro-optical device.
FIG. 12F shows an alternate cut-away view of the exemplary two-layer electrode shown in FIG. 10C in an non-island configuration as seen from a location which would not contact an electro-optical device.

FIG. 12A shows a cut-through view of the prior art structure described above with reference to FIG. 10A as seen from line F12A.

FIG. 12B shows a cut-through view of FIG. 10B as seen from line F12B. As in FIG. 11B, the second electrode layer 2102 is shown on top of the first transparent electrode layer 2101 in FIG. 12B. As described above in reference to FIG. 11B, the second electrode may extend over the edges of the first electrode or may in fact reside on the same level of the first electrode contacting it horizontally rather than vertically in this embodiment.

FIGS. 12C and 12F show cut-through views of FIG. 10C as seen from line F12C. FIG. 12C illustrates an island configuration of the exemplary electrode shown in FIG. 10C and FIG. 12F illustrates a non-island configuration of the exemplary electrode shown in FIG. 10C.

FIG. 12D shows a cut-through view of FIG. 10D as seen from line F12D.

FIG. 12E shows a cut-through view of FIG. 10E as seen from line F12E.

The exemplary two layer electrode structures described above are well suited to many applications. One exemplary application that has been contemplated is the video tile illustrated in FIG. 2. In this embodiment the column electrodes 320 are formed as illustrated in FIG. 10D. First the island configuration of the first electrode layer 2101 are formed out of ITO. The second layer 2102 is then deposited in the pattern shown in FIG. 10D with the uncovered portions of the ITO islands defining the desired active pixel areas. This second layer includes three sub-layers, one on top of the next: the first of titanium-tungsten; the second of aluminum; and the third of Teflon.

Although the embodiments of the invention described above have been in terms of a tiled OLED display device, it is contemplated that similar concepts may be practiced with other types of tiled or non-tiled electro-optical devices or electronic structures fabricated using liquid deposition of materials. Also, it will be understood by one skilled in the art that a number of other modifications exist which do not deviate from the scope of the present invention as defined by the claims.

What is claimed:

1. A method of depositing at least one island of a liquid electronic material in a precise pattern on at least one electrode on a surface comprising the steps of;

forming a first layer of the at least one electrode on the surface to provide at least one electrical contact to the at least one island;

forming a second layer of the at least one electrode on a portion of the first layer of the at least one electrode substantially surrounding the precise pattern of the at least one island; and depositing the liquid material on the at least one electrode so that the second layer of the at least one electrode constrains the liquid electronic material in the precise pattern.

2. A two layer electrode structure to promote the deposition of a fluid in a precise island pattern comprising;

a first electrode layer formed on a surface;

at least one island of the fluid in the precise island pattern formed on the first electrode layer and in electrical contact with the first electrode layer; and a second layer formed in contact with the first electrode layer and substantially surrounding the at least one island of the precise island pattern.

3. The two layer electrode structure of claim 2, wherein the second layer is a low surface energy material.

4. The two layer electrode structure of claim 3, wherein the low surface energy material is at least one of Teflon and polyamide.

5. The two layer electrode structure of claim 2, wherein the second layer is a conductor.

6. The two layer electrode structure of claim 2, wherein the second layer includes a plurality of sub-layers.

7. The two layer electrode structure of claim 6, wherein an exposed sub-layer of the second layer is a low surface energy material.

8. The two layer electrode structure of claim 6, wherein at least one sub-layer of the second layer includes a conductor.

9. The two layer electrode structure of claim 2, wherein the first electrode layer is a transparent conducting material.

10. The two layer electrode structure of claim 9, wherein the second layer includes a high conductivity material that is electrically coupled to the first electrode layer.

11. The two layer electrode structure of claim 10, wherein; the second layer includes a plurality of sub-layers; and an exposed sub-layer of the second layer is a low surface energy material.

12. The two layer electrode structure of claim 10, wherein the first electrode layer is formed in the precise island pattern.

13. The two layer electrode structure of claim 2, wherein the first electrode layer is at least one of indium-tin oxide (ITO) polyaniline, and a thin metal.

14. The two layer electrode structure of claim 2, wherein the fluid is a liquid deposited material.

15. The two layer electrode structure of claim 2, wherein the fluid is at least one of a liquid crystal material, an organic light emitting diode (OLED) material, an electron transport layer material, a hole transport layer material, an insulator material, and a color filter material.

16. The two layer electrode structure of claim 2, wherein the fluid is a powder deposition material.

17. A method of improving a conductivity of a transparent electrode structure in an electro-optical device comprising the steps of;

forming a transparent electrode material on a surface of the electro-optical device; and forming a high conductivity material on the surface of the electro-optical device, the high conductivity material being one of adjacent to and on top of the transparent electrode material;

wherein the high conductivity material is in electrical contact with the transparent electrode material and is configured not to obscure light passing through the transparent electrode material.

18. An electrode structure comprising;

a substrate having a surface;

a first transparent electrode layer formed in a first area of the surface which corresponds to at least one transparent window; and a second electrode layer having a higher conductivity than the first electrode layer and being formed in a second area of the surface, the second electrode layer being one of adjacent to and on top of the first transparent electrode layer and being electrically coupled to the first transparent electrode layer.

19. The two layer electrode structure of claim 18, wherein the second layer is composed of a plurality of sub-layers.

20. The two layer electrode structure of claim 19, wherein an exposed sub-layer of the second layer is a low surface energy material.

21. The two layer electrode structure of claim 18, wherein the first transparent electrode layer is indium-tin oxide (ITO).

22. The two layer electrode structure of claim 21, wherein the second layer is at least one of polysilicon and a metallic conductor.

23. The two layer electrode structure of claim 21, wherein;

the second layer has a plurality of sub-layers, including;

a contact sub-layer including one of titanium-tungsten, palladium, and titanium, which is in electrical contact with the first transparent electrode layer; and an aluminum sub-layer which is in electrical contact with the contact sub-layer.

24. The two layer electrode structure of claim 23, further including an exposed sub-layer formed from a low surface energy material.

25. The two layer electrode structure of claim 18, wherein the first transparent electrode layer is one of tin oxide, indium-tin oxide, gold, calcium, and polyaniline.

26. The two layer electrode structure of claim 18, wherein the second area of the surface corresponds to at least one non-transparent section.

27. The two layer electrode structure of claim 26, wherein the first area of the surface includes a portion of at least one non-transparent section.

28. The two layer electrode structure of claim 27, wherein the portion of each non-transparent section on which the first transparent electrode layer is formed is a whole of the at least one non-transparent section.

29. The two layer electrode structure of claim 18, wherein the first transparent electrode layer and the second electrode layer extend to a substantially equal height above the surface.

30. The two layer electrode structure of claim 26, wherein the at least one non-transparent section surrounds the at least one transparent window.

* * * * *